United States Patent
Lee et al.

(10) Patent No.: US 10,908,733 B2
(45) Date of Patent: Feb. 2, 2021

(54) DISPLAY DEVICE AND METHOD OF MANUFACTURING THE SAME

(71) Applicant: Samsung Display Co., Ltd., Yongin-si (KR)

(72) Inventors: Daegeun Lee, Hwaseong-si (KR); Joonsam Kim, Hwaseong-si (KR); Myonghoon Roh, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/428,619

(22) Filed: May 31, 2019

(65) Prior Publication Data

US 2020/0034020 A1 Jan. 30, 2020

(30) Foreign Application Priority Data

Jul. 25, 2018 (KR) ........................ 10-2018-0086788

(51) Int. Cl.
| | |
|---|---|
| *G06F 3/041* | (2006.01) |
| *H01L 27/32* | (2006.01) |
| *H01L 51/52* | (2006.01) |
| *H01L 51/56* | (2006.01) |
| *G06F 3/044* | (2006.01) |

(52) U.S. Cl.
CPC ........ *G06F 3/04164* (2019.05); *H01L 27/323* (2013.01); *H01L 27/3244* (2013.01); *H01L 51/5246* (2013.01); *H01L 51/56* (2013.01); *G06F 3/044* (2013.01); *G06F 3/0414* (2013.01); *G06F 2203/04103* (2013.01); *H01L 2227/323* (2013.01)

(58) Field of Classification Search
CPC .... G06F 3/04164; G06F 3/0414; G06F 3/044; G06F 2203/04103; H01L 27/323; H01L 27/3244; H01L 2227/323; H01L 51/5246; H01L 51/56
USPC ......................................................... 345/174
See application file for complete search history.

(56) References Cited

U.S. PATENT DOCUMENTS

| | | | |
|---|---|---|---|
| 7,790,595 | B2 | 9/2010 | Asakawa et al. |
| 9,229,570 | B2 | 1/2016 | Choi et al. |
| 9,323,372 | B2 | 4/2016 | Kim et al. |

(Continued)

FOREIGN PATENT DOCUMENTS

| | | |
|---|---|---|
| KR | 10-2010-0106669 A | 10/2010 |
| KR | 10-1082162 | 11/2011 |
| KR | 10-2014-0045151 A | 4/2014 |

*Primary Examiner* — Mark Edwards
(74) *Attorney, Agent, or Firm* — Lewis Roca Rothgerber Christie LLP (57) ABSTRACT

A display device includes: a substrate; a sealing substrate opposing the substrate, and including a first surface adjacent to the substrate and a second surface opposing the first surface; a pixel unit between the substrate and the sealing substrate; a sealing member between the substrate and the sealing substrate, spaced apart from the pixel unit, and bonding the substrate and the sealing substrate to each other; a touch sensing unit on the second surface of the sealing substrate; a touch pad on the second surface of the sealing substrate, and overlapping the sealing member; and a touch circuit board on the touch pad and connected to the touch pad. The touch pad includes: a first conductive pad; and a second conductive pad on the first conductive pad, and having an area less than an area of the first conductive pad.

20 Claims, 8 Drawing Sheets

(56) References Cited

U.S. PATENT DOCUMENTS

2011/0134056 A1* 6/2011 Kim .................... G06F 3/0412
345/173
2014/0071081 A1* 3/2014 Shedletsky ............. H05K 7/06
345/174

* cited by examiner

FIG. 15

DISPLAY DEVICE AND METHOD OF MANUFACTURING THE SAME

CROSS-REFERENCE TO RELATED APPLICATION

This application claims priority to and the benefit of Korean Patent Application No. 10-2018-0086788, filed on Jul. 25, 2018, in the Korean Intellectual Property Office (KIPO), the disclosure of which is incorporated by reference herein in its entirety.

BACKGROUND

1. Field

Aspects of some example embodiments of the present invention relate to a is display device and a method of manufacturing the display device.

2. Discussion of the Related Art

Display devices may be classified into liquid crystal display ("LCD") devices, organic light emitting diode ("OLED") display devices, plasma display panel ("PDP") devices, electrophoretic display devices, or the like based on a light emitting scheme thereof.

A display device may include a touch sensing unit as an input means, which is capable of recognizing a touch input by a user. In addition, a display device may include a circuit member, such as a touch circuit board or a touch driving chip, to control the driving of the touch sensing unit. Most of the touch driving chips may be mounted on an edge or a back surface of a display panel. For example, the touch driving chip may be directly mounted on a display panel in a chip on glass (COG) manner using an anisotropic conductive film (ACF), or may be mounted on a tape carrier package (TCP) or a flexible film and then connected to a display panel in a chip on film (COF) manner.

As the resolution of display devices increases, the area of the non-display area of display devices is reduced, and the width and interval of wirings becomes narrower, it may be difficult to stably connect a circuit member such as a touch circuit board and a touch driving chip to a display panel.

It is to be understood that this background of the technology section is intended to provide useful background for understanding the technology of example embodiments of the present invention, and the present Background section may include ideas, concepts, or recognitions that were not part of what was known or appreciated by those skilled in the pertinent art prior to a corresponding effective filing date of subject matter disclosed herein. Therefore, the information presented in the present Background section should not be construed as Applicant-admitted prior art.

SUMMARY

Aspects of some example embodiments of the present invention relate to a display device and a method of manufacturing the display device, and for example, to a display device including a touch sensing unit and to a method of manufacturing the display device.

Aspects of some example embodiments of the present invention may be directed to a display device configured to prevent (or substantially prevent) uncuring of a curable material for forming a sealing member and ultrasonically bonding a touch pad and a touch circuit board to each other stably, thus improving the reliability of the display device.

According to some example embodiments, a display device includes: a substrate; a sealing substrate opposing the substrate, and including a first surface adjacent to the substrate and a second surface opposing the first surface; a pixel unit between the substrate and the sealing substrate; a sealing member between the substrate and the sealing substrate, spaced apart from the pixel unit, and bonding the substrate and the sealing substrate to each other; a touch sensing unit on the second surface of the sealing substrate; a touch pad on the second surface of the sealing substrate, and overlapping the sealing member; and a touch circuit board on the touch pad and connected to the touch pad. The touch pad includes: a first conductive pad; and a second conductive pad on the first conductive pad, and having an area less than an area of the first conductive pad. The second conductive pad is ultrasonically bonded to the touch circuit board.

The first conductive pad may include at least one of indium tin oxide (ITO), indium zinc oxide (IZO), zinc oxide (ZnO), and indium tin zinc oxide (ITZO).

The second conductive pad may include at least one of Ag, Mg, Al, Mo, Pt, Pd, Au, Ni, Nd, Ir, Cr, Li, Ca, Ti, Sn, and Cu.

The second conductive pad may have a multilayer structure in which a plurality of layers are stacked.

The second conductive pad may have an area less than or equal to about ½ of the area of the first conductive pad.

The first conductive pad may be apart from the touch circuit board, and the second conductive pad directly contacts the touch circuit board.

The sealing member may include glass frit or a polymer resin.

The touch circuit board may include a base film, a cover film, and a wiring pattern portion between the base film and the cover film.

The wiring pattern portion may directly contact the second conductive pad, and be ultrasonically bonded to the second conductive pad.

The wiring pattern portion may include at least one of Ag, Mg, Al, Mo, Pt, Pd, Au, Ni, Nd, Ir, Cr, Li, Ca, Ti, Sn, and Cu.

The second conductive pad may have a closed loop shape that overlaps an edge portion of the first conductive pad in a plan view.

The second conductive pad may further include a third conductive pad extending from the second conductive pad in the closed loop shape.

The second conductive pad may be in the form of a plurality of lines or a plurality of islands.

The second conductive pad may have a zigzag shape.

According to an embodiment, a method of manufacturing a display device includes: locating a pixel unit on a substrate; locating a touch pad on a sealing substrate, the touch pad including a first conductive pad, and a second conductive pad on the first conductive pad and having an area less than an area of the first conductive pad; locating a curable material between the substrate and the sealing substrate to overlap the touch pad; outputting a laser beam toward the curable material through at least a part of the touch pad; forming a sealing member by curing the curable material; locating a touch circuit board on the touch pad; and ultrasonically bonding the second conductive pad and the touch circuit board to each other.

The first conductive pad may include at least one of indium tin oxide (ITO), indium zinc oxide (IZO), zinc oxide (ZnO), and indium tin zinc oxide (ITZO).

The second conductive pad may include at least one of Ag, Mg, Al, Mo, Pt, Pd, Au, Ni, Nd, Ir, Cr, Li, Ca, Ti, Sn, and Cu.

The second conductive pad may have a multilayer structure in which a plurality of layers are stacked.

The second conductive pad may have an area less than or equal to about ½ of the area of the first conductive pad.

The sealing member may include glass frit or a polymer resin.

The method may further include: forming an alignment line on the first insulating layer, the alignment line connected to the first alignment electrode; and disconnecting a part of the alignment line after applying the first alignment signal and the second alignment signal.

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

A more complete appreciation of the present invention will become more apparent by describing in detail embodiments thereof with reference to the accompanying drawings, wherein.

DETAILED DESCRIPTION

Aspects of some example embodiments will now be described more fully hereinafter with reference to the accompanying drawings. Although the invention may be modified in various manners and have several embodiments, some example embodiments are illustrated in the accompanying drawings and will be mainly described in the specification. However, the scope of the invention is not limited to the example embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device located "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of variation for the particular value as determined by one of ordinary skill in the art, considering the measurement in question and the error associated with measurement of the particular quantity (i.e., the limitations of the measurement system). For example, "about" may mean within one or more standard variations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to in specific describe embodiments of the present invention and like reference numerals refer to like elements throughout the specification.

Hereinafter, an embodiment of the present invention will be described with reference to FIGS. 1 to 8.

Figure 1:
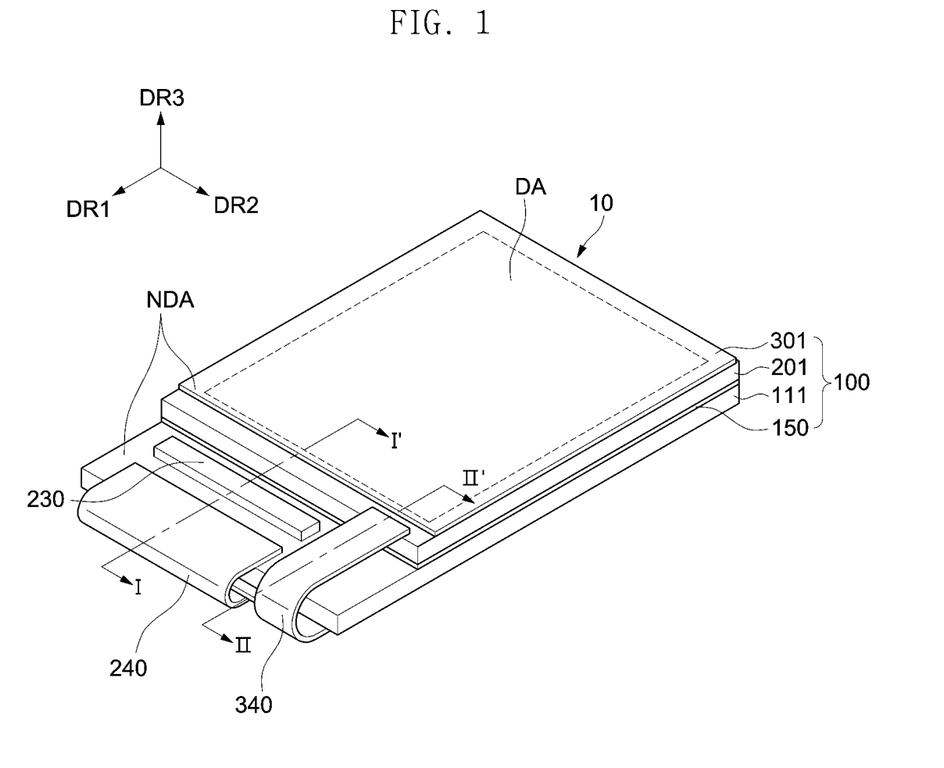
FIG. 1 is a perspective view illustrating a display device according to some example embodiments of the present invention.
Figure 2:
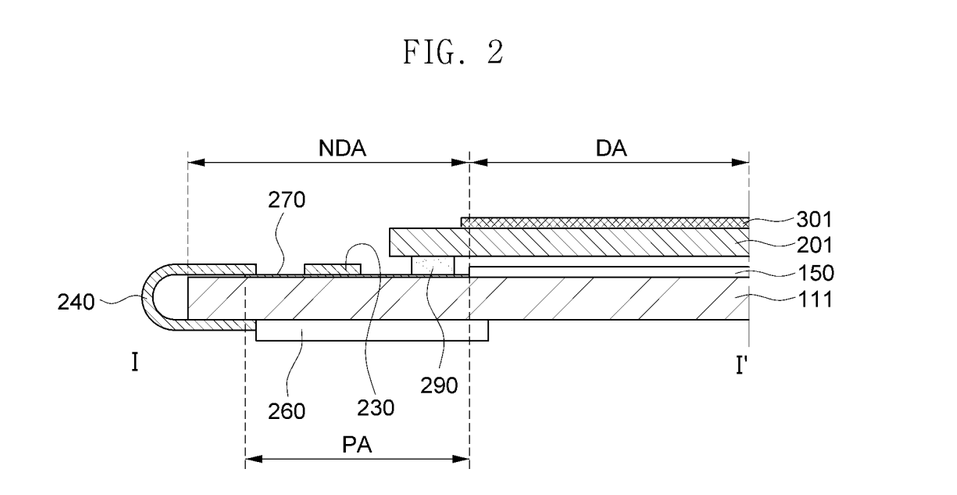
FIG. 2 is a cross-sectional view taken along the line I-I' of FIG. 1.
Figure 3:
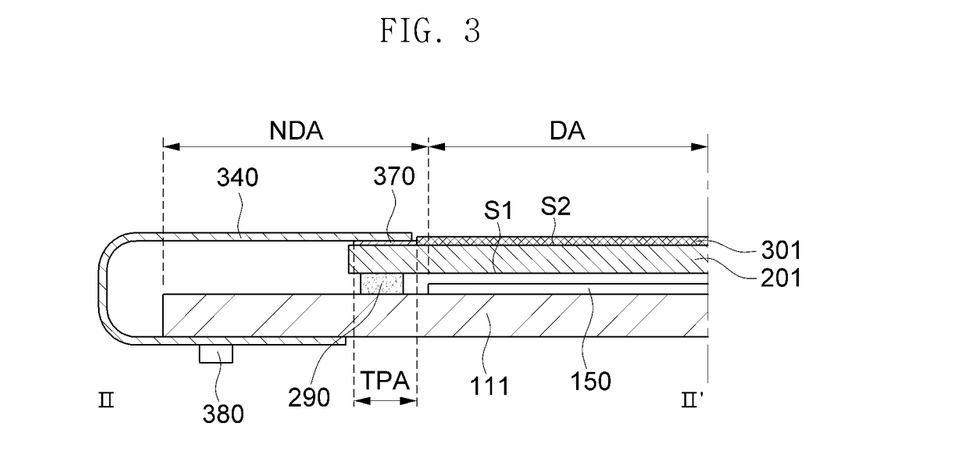
FIG. 3 is a cross-sectional view taken along the line II-II' of FIG. 1.

FIG. 1 is a perspective view illustrating a display device according to an embodiment of the present invention, FIG. 2 is a cross-sectional view taken along line I-I' of FIG. 1, and FIG. 3 is a cross-sectional view taken along line II-II' of FIG. 1.

Referring to FIGS. 1, 2, and 3, a display device includes a display panel 100, a driving chip 230, a circuit board 240, a printed circuit board ("PCB") 260, a touch circuit board 340, and a touch driving chip 380. As used herein, a direction in which the circuit board 240 and the touch circuit board 340 that are bonded to the display panel 100 extend toward a side surface of the display panel 100 will be referred to as a first direction DR1, a direction perpendicular to the first direction DR1 in a plan view will be referred to as a second direction DR2, and a thickness direction of the display panel 100 perpendicular to the first and second directions DR1 and DR2 will be referred to as a third direction DR3.

The display panel 100 is a panel configured to display images, and may be an organic light emitting diode ("OLED") display panel. Alternatively, the display panel 100 may be any one of a liquid crystal display ("LCD") panel, an electrophoretic display panel, an LED panel, an inorganic electro luminescent ("EL") display panel, a field emission display ("FED") panel, a surface conduction electron-emitter display ("SED") panel, a plasma display panel ("PDP"), and a cathode ray tube ("CRT") display panel. However, these are merely examples, and any type of display panels which have been currently developed and commercialized or which may be implemented according to the future development of technology may be used as the display panel 100 according to the present invention.

The display panel 100 includes a substrate 111, a sealing substrate 201 opposing the substrate 111, a pixel unit 150, a sealing member 290, and a touch sensing unit 301. However, embodiments are not limited thereto, and the substrate 111 may be encapsulated with a thin film encapsulation layer or the like, rather than the sealing substrate 201.

The substrate 111 includes a display area DA in which display is performed thereon through light emission, and a non-display area NDA located outside the display area DA. A plurality of pixels are located in the display area DA of the substrate 111, thus forming the pixel unit 150.

The non-display area NDA of the substrate 111 includes a pad area PA at which a plurality of pad wirings 270 for receiving external signals that are used to control light emission of the pixel unit 150 and transmitting the signals to the pixel unit 150 are located. The driving chip 230 may be located at the pad area PA.

The pixel unit 150 is located on the substrate 111, and although not illustrated, includes an OLED and a wiring unit for driving the OLED. The wiring unit of the pixel unit 150 is connected to the driving chip 230. Any element, other than the OLED, applicable to a display device may be used to constitute the pixel unit 150.

The sealing substrate 201 is located opposing the substrate 111. The sealing substrate 201, similar to the substrate 111, includes a display area DA and a non-display area NDA. The sealing substrate 201 includes a first surface S1 adjacent to the substrate 111, and a second surface S2 opposing the first surface S1. The sealing substrate 201 is attached to the substrate 111 using a sealing member 290. The first surface S1 of the sealing substrate 201 may directly contact the sealing member 290. The sealing substrate 201 covers and protects the pixel unit 150. An area of the sealing substrate 201 may be less than an area of the substrate 111. Accordingly, the pad area PA of the substrate 111 may be exposed by the sealing substrate 201.

The non-display area NDA of the sealing substrate 201 includes a touch pad area TPA at which a plurality of touch pad wirings 370 for receiving touch signals via the touch sensing unit 301 and transmitting the touch signals to the touch driving chip 380 are located. In particular, the touch sensing unit 301 and the touch pad wiring 370 are located on the second surface S2 of the sealing substrate 201.

The substrate 111 and the sealing substrate 201 may each be a plastic film having flexible characteristics. For example, the substrate 111 and the sealing substrate 201 may include polyimide. However, embodiments are not limited thereto, and the substrate 111 and the sealing substrate 201 may each include an insulating material such as glass or quartz. The substrate 111 and the sealing substrate 201 may each include a material selected from materials having excellent mechanical strength, thermal stability, transparency, surface smoothness, ease of handling, and water resistance.

The sealing member 290 may include glass frit or a polymer resin. The sealing member 290 may be formed by applying glass frit or a polymer resin, and then curing it with heat, ultraviolet rays, infrared rays, laser, or the like. For example, the sealing member 290 may be formed by outputting a laser to a laser-reactive glass frit.

The touch sensing unit 301 is located on the sealing substrate 201. The touch sensing unit 301 may be located corresponding to at least a part of the display area DA and the non-display area NDA of the sealing substrate 201. In addition, the touch sensing unit 301 may be located corresponding only to the display area DA. Although not illustrated, the touch sensing unit 301 includes a plurality of sensing electrodes. Each of the plurality of sensing electrodes may be directly patterned on the sealing substrate 201 as an on-cell type. In addition, the touch sensing unit 301 may be formed on a separate panel to be located on the sealing substrate 201.

The touch sensing unit 301 recognizes a touch input by a touch means such as a pen or a finger of a user, and transmits a signal corresponding to a position where the touch input is applied to the touch driving chip 380. The touch sensing unit 301 is used as an input means for the display device 10, and may be of a pressure sensitive type or a capacitive type.

According to some example embodiments, a polarizer and a window may be located on the touch sensing unit 301. The polarizer may prevent (or substantially prevent) reflection of external light. The window may protect the display panel 100 so that the display panel 100 is not damaged by an external impact.

The driving chip 230 may include a driver for driving the pixel unit 150. The driving chip 230 may generate a scan signal and a data signal corresponding to electrical signals transmitted via the circuit board 240. The scan signal and the data signal are applied to a gate line and a data line of the display area DA through the pad wiring 270.

The driving chip 230 may be mounted at the pad area PA of the substrate 111 in a chip on glass (COG) manner so as to be electrically connected to the pad wiring 270 of the pad area PA. For example, the driving chip 230 may directly contact and be electrically connected to the pad wiring 270 of the pad area PA through an ultrasonically bonding process.

In addition, the driving chip 230 may be mounted on the circuit board 240 in a chip on film (COF) manner. That is, a tape carrier package (TCP) in which the driving chip 230 is mounted on a film in the form of a chip may be applied to the display device 10. The driving chip 230 may be an integrated circuit (IC) chip such as a driving IC.

The circuit board 240 may be a flexible printed circuit board (FPCB). The circuit board 240 is bent along a side surface of the display panel 100. That is, one end portion of the circuit board 240 may be located on an upper surface of the substrate 111 to be connected with the pad wiring 270, and another end portion of the circuit board 240 may be located on a back surface of the substrate 111. The circuit board 240 may directly contact the pad wiring 270 of the pad area PA, or be electrically connected to the pad wiring 270 of the pad area PA using an anisotropic conductive film or the like. For example, the circuit board 240 may directly contact and be electrically connected to the pad wiring 270 of the pad area PA through an ultrasonically bonding process.

The circuit board 240 is connected to the pad wiring 270 of the pad area PA and provides electrical signals to the display panel 100. For example, the electrical signal may include at least one of a power signal, a drive signal, a control signal, and a data signal. The circuit board 240 may include, for example, a timing controller that generates a control signal for driving the display panel 100 and a power voltage generator that generates a power voltage The PCB 260 is a circuit board for applying drive signals to the display panel 100. The PCB 260 may include, for example, a timing controller that generates a control signal for driving the display panel 100 and a power voltage generator for generating a power voltage.

The PCB 260 may be located on one surface of the display panel 100. More specifically, the PCB 260 may be located on a back surface of the display panel 100. Generally, the display panel 100 displays images on the side of an upper surface of the display panel 100, and the back surface of the display panel 100 is an area which cannot be viewed by a user. Accordingly, in order to maximize spatial efficiency and hide components which do not need to be viewed by a user, the PCB 260 may be located on the side of the back surface of the display panel 100. However, this is merely an example, and the PCB 260 may be located on a side surface of the display panel 100, and the PCB 260 may be unitarily formed with the circuit board 240, as desired.

The touch circuit board 340 may be a flexible printed circuit board ("FPCB"). The touch circuit board 340 is bent along a side surface of the display panel 100. That is, one end portion of the touch circuit board 340 may be located on an upper surface of the sealing substrate 201 to be connected with the touch pad wiring 370, and another end portion of the touch circuit board 340 may be located on the back surface of the substrate 111. The touch circuit board 340 according to an embodiment of the present invention directly contacts the touch pad wiring 370 of the touch pad area TPA. In particular, the touch circuit board 340 may directly contact and be electrically connected to the touch pad wiring 370 of the pad area PA through an ultrasonically bonding process.

The touch circuit board 340 is connected to the touch pad wiring 370 of the touch pad area TPA and provides electrical signals to the touch driving chip 380. The touch driving chip 380 controls driving of the touch sensing unit 301.

The touch driving chip 380 is located on the touch circuit board 340. However, embodiments are not limited thereto, and the touch driving chip 380 may be mounted at the non-display area NDA of the substrate 111 or the sealing substrate 201 in a chip on glass (COG) manner. The touch driving chip 380 may be an IC chip such as a driving IC.

Figure 4:
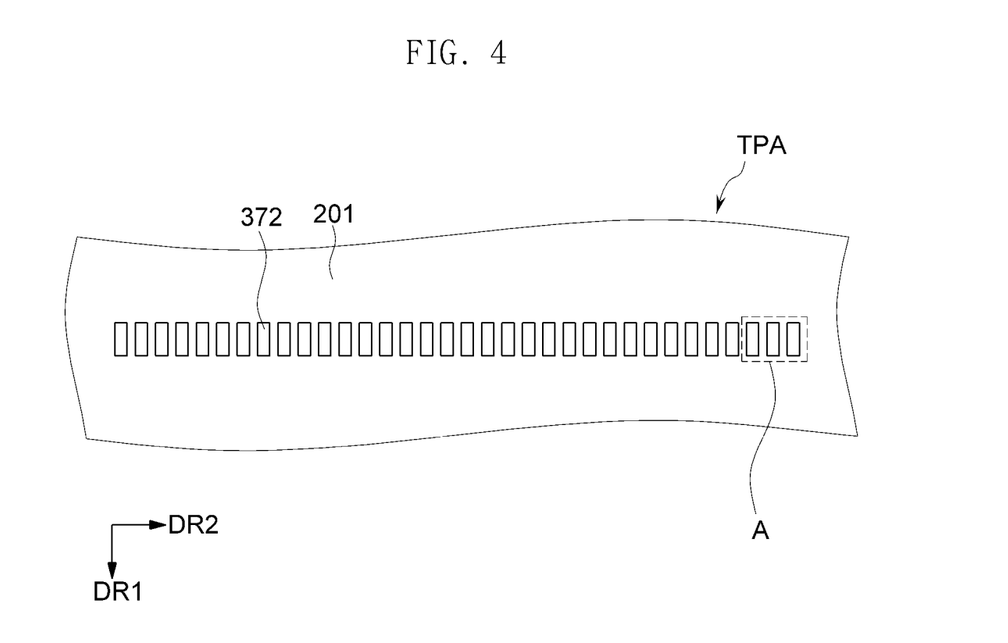
FIG. 4 is a plan view illustrating a part of a touch pad area according to some example embodiments of the present invention.
Figure 5:
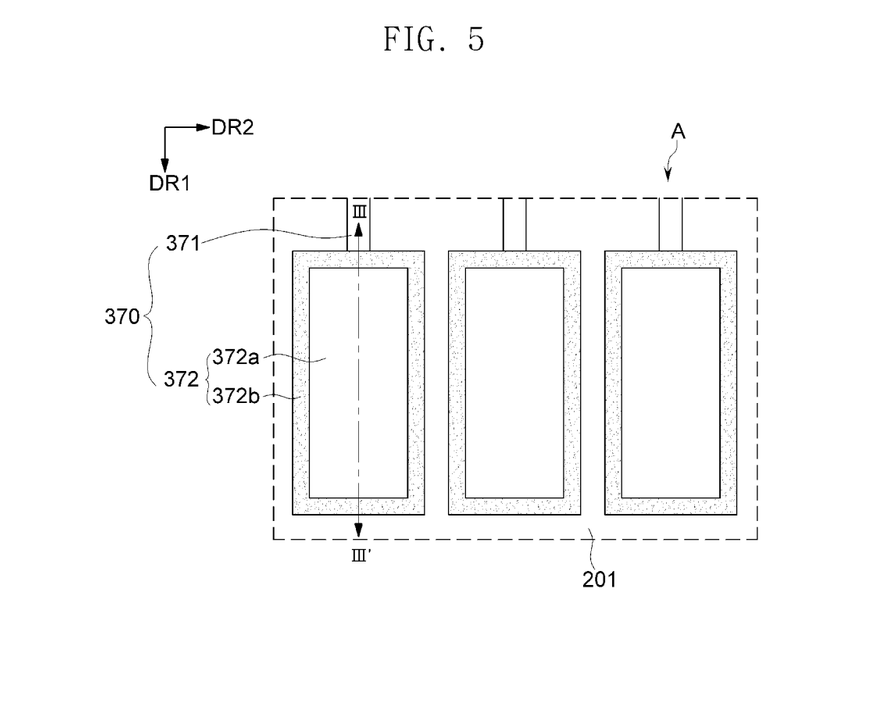
FIG. 5 is a plan view enlarging the area A in FIG. 4.
Figure 6:
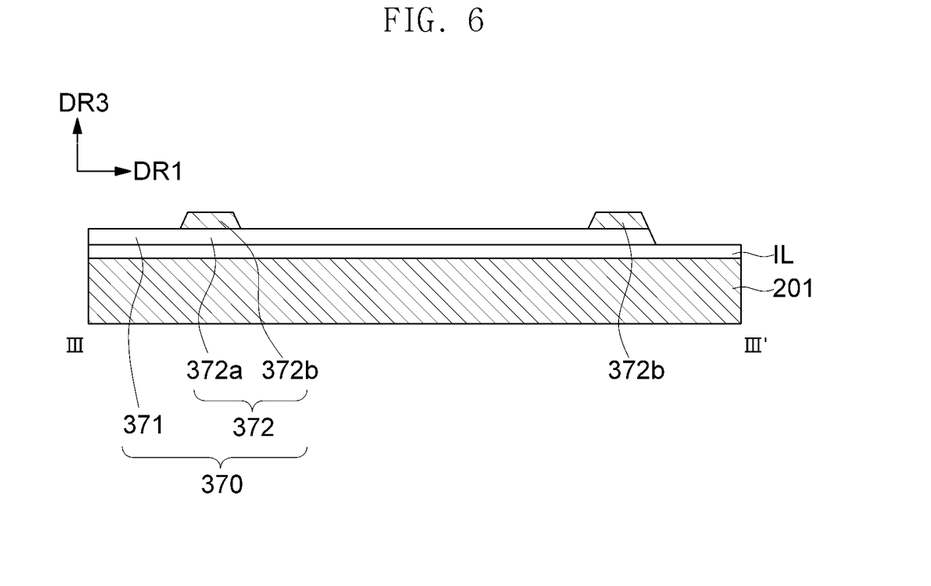
FIG. 6 is a cross-sectional view taken along the line III-III' of FIG. 5.
Figure 7:
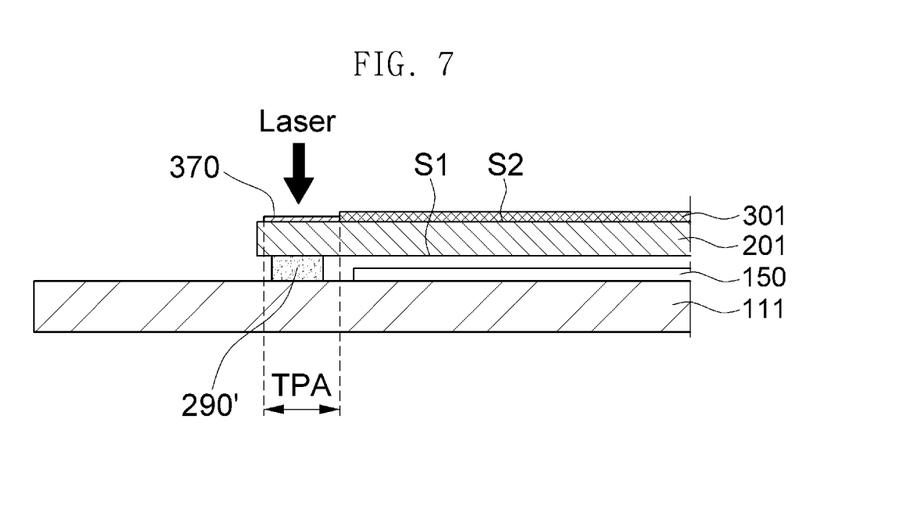
FIG. 7 is a cross-sectional view illustrating a method of manufacturing a display device according to some example embodiments of the present invention.
Figure 8:
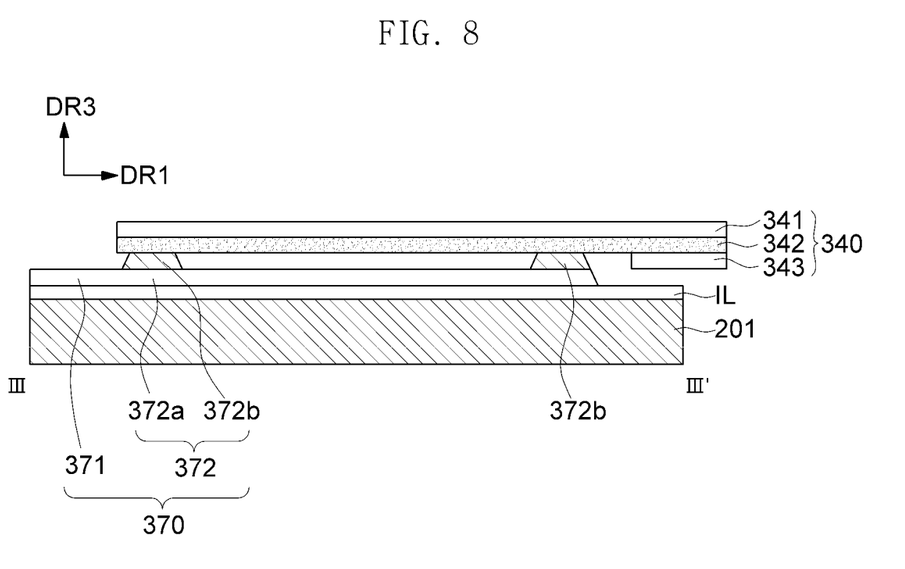
FIG. 8 is a cross-sectional view illustrating a contact portion between a touch pad and a touch circuit board according to some example embodiments of the present invention.

FIG. 4 is a plan view illustrating a part of a touch pad area according to an embodiment of the present invention, FIG. 5 is a plan view enlarging area A in FIG. 4, FIG. 6 is a cross-sectional view taken along the line of FIG. 5, FIG. 7 is a cross-sectional view illustrating a method of manufacturing a display device according to an embodiment of the present invention, and FIG. 8 is a cross-sectional view illustrating a contact portion between a touch pad and a touch circuit board according to an embodiment of the present invention.

Referring to FIGS. 4 and 5, the touch pad wiring 370 includes a plurality of sensing lines 371 extending from the touch sensing unit 301, and a plurality of touch pads 372 located at ends of the plurality of sensing lines 371, respectively. The touch pad wiring 370 is located at the touch pad area TPA of the sealing substrate 201. The plurality of touch pads 372 may be arranged in a line along the second direction DR2 away from each other. However, embodiments are not limited thereto, and the plurality of touch pads 372 may be arranged in a matrix form along a plurality of rows and a plurality of columns.

The plurality of sensing lines 371 extend from the plurality of sensing electrodes of the touch sensing unit 301 to the plurality of touch pads 372 to electrically connect the touch sensing unit 301 and the touch pad 372.

The touch pad 372 is electrically connected to the touch circuit board 340. In particular, the touch pad 372 directly contacts and is electrically connected to the touch circuit board 340 through an ultrasonically bonding process, which will be described in detail below.

Referring to FIGS. 5 and 6, the touch pad 372 includes a first conductive pad 372a and a second conductive pad 372b.

The first conductive pad 372a is located on the sealing substrate 201. At least one insulating layer IL may be located between the sealing substrate 201 and the first conductive pad 372a. The insulating layer IL serves to prevent (or substantially prevent) penetration of impurities and to planarize the surface, and may include various materials capable of performing such a role. For example, the insulating layer IL may include one of silicon nitride ($SiN_x$), silicon oxide ($SiO_2$), and silicon oxynitride ($SiO_xN_y$), for example. However, the insulating layer IL is not necessarily required, and may be omitted.

The first conductive pad 372a extends from the sensing line 371 that is connected to the sensing electrode of the touch sensing unit 301. The first conductive pad 372a may have a greater width than a width of the sensing line 371. The plurality of first conductive pads 372a may be arranged in a line along the second direction DR2 away from each other. However, embodiments are not limited thereto, and the plurality of first conductive pads 372a may be arranged in a matrix along the first direction DR1 and the second direction DR2.

The first conductive pads 372a may have a quadrangular shape in a plan view. However, embodiments are not limited thereto, and the first conductive pads 372a may be formed in various shapes in a plan view.

The first conductive pad 372a includes a transparent conductive material. For example, the first conductive pad 372a may include at least one of conductive oxides such as indium tin oxide (ITO), indium zinc oxide (IZO), zinc oxide (ZnO), and indium tin zinc oxide (ITZO).

The first conductive pad 372a may include a material the same as (or substantially the same as) a material included in the sensing line 371. For example, the first conductive pad 372a and the sensing line 371 may be formed simultaneously (or substantially simultaneously) in a same (or a substantially same) process. However, embodiments are not limited thereto, and the first conductive pad 372a may include a material different from a material included in the sensing line 371, and may be formed in a separate process.

The second conductive pad 372b is located on the first conductive pad 372a. Specifically, the second conductive pad 372b is located overlapping at least a part of the first conductive pad 372a in the third direction DR3. The first conductive pad 372a and the second conductive pad 372b may be sequentially deposited on the sealing substrate 201.

The second conductive pad 372b is a portion that directly contacts and is bonded to the touch circuit board 340. The second conductive pad 372b according to an embodiment of the present invention includes a material applicable to ultrasonically bonding. The second conductive pad 372b may include a metal material including at least one of Ag, Mg, Al, Mo, Pt, Pd, Au, Ni, Nd, Ir, Cr, Li, Ca, Ti, Sn, and Cu. The second conductive pad 372b may have a multilayer structure in which a plurality of layers are stacked. For example, the second conductive pad 372b may include a Ti/Al/Ti alloy.

The second conductive pad 372b according to an embodiment of the present invention has a closed loop shape overlapping an edge portion of the first conductive pad 372a in a plan view, as illustrated in FIG. 5. In specific, the first conductive pad 372a and the second conductive pad 372b are located overlapping each other at an edge of the touch pad 372, and only the first conductive pad 372a is located at a center portion of the touch pad 372.

The second conductive pad 372b has an area less than an area of the first conductive pad 372a in a plan view. For example, the second conductive pad 372b may have an area less than or equal (or substantially equal) to about ½ of the area of the first conductive pad 372a. That is, an area where only the first conductive pad 372a including a transparent conductive material is located may be larger than or equal (or substantially equal) to about ½ of an entire area of the touch pad 372 in a plan view.

The sealing substrate 201 according to an embodiment of the present invention is bonded to the substrate 111 using the sealing member 290, and the sealing member 290 is located overlapping the touch pad 372 of the sealing substrate 201 in the third direction DR3. The sealing member 290 may be formed by applying glass frit or a polymer resin, and then curing it with heat, ultraviolet rays, infrared rays, laser, or the like. For example, the sealing member 290 may be formed by outputting a laser to a laser-reactive glass frit.

In specific, referring to FIG. 7, a curable material 290' such as a laser-reactive glass frit is applied between the substrate 111 and the sealing substrate 201, and then a laser beam is directed to the curable material 290' so that the sealing member 290 is formed. In such an embodiment, the touch pad 372 is located overlapping the sealing member 290, on the second surface S2 of the sealing substrate 201 to be irradiated with the laser beam. In a case where the touch pad 372 overlapping the sealing member 290 only includes an opaque metal, it is difficult for the irradiated laser to proceed through the touch pad 372, and accordingly, a problem whereby a part of the curable material 290' is uncured may occur.

Because the touch pad 372 according to an embodiment of the present invention includes, in a plan view, an area where only the first conductive pad 372a which is transparent is located, a laser beam for curing the curable material 290' may proceed through the touch pad 372. Accordingly, the problem of the curable material 290' being uncured may be prevented (or substantially prevented), and an issue of the sealing member 290 being detached from the substrate 111 or the sealing substrate 201 may be prevented (or substantially prevented).

Referring to FIG. 8, the touch circuit board 340 bonded to the touch pad 372 includes a base film 341, a wiring pattern portion 342, and a cover film 343. The base film 341 and the cover film 343 include a material excellent in flexibility, insulation, and heat resistance. For example, the base film 341 and the cover film 343 may include polyimide, but embodiments are not limited thereto.

The wiring pattern portion 342 is a portion including a wiring pattern for transmitting electric signals, and is located between the base film 341 and the cover film 343. The wiring pattern portion 342 of the touch circuit board 340 directly contacts and is bonded to the second conductive pads 372b of the touch pad 372. The wiring pattern portion 342 is ultrasonically bonded to the second conductive pad 372b, and thus the wiring pattern portion 342 includes a material applicable to ultrasonically bonding. The wiring pattern portion 342 may include a metal material including at least one of Ag, Mg, Al, Mo, Pt, Pd, Au, Ni, Nd, Ir, Cr, Li, Ca, Ti, Sn, and Cu. The wiring pattern portion 342 may have a multilayer structure in which a plurality of layers are stacked. For example, the wiring pattern portion 342 may include an Au alloy.

The ultrasonically bonding process is a process of applying mechanical vibration energy of the ultrasonic frequency band to a metal, to be subject to bonding, along with a pressure, to generate frictional heat between the metal and the bonded surface, whereby a temperature of the metal surface momentarily reaches the temperature at which the metal surface is plastic-deformed by the frictional heat, and metal molecules in contact with each other are bonded together. Because the metal portion bonded by this ultrasonically bonding process is subject to molecular bonding, rigidity is high and electric conductivity is high. In addition, the ultrasonically bonding process may minimize (or substantially minimize, prevent, or substantially prevent) the damage to the display panel 100, and may be applied to bonding between different kinds of metals.

A height of an upper surface of the first conductive pad 372a from the sealing substrate 201 is less than a height of an upper surface of the second conductive pad 372b from the sealing substrate 201. Accordingly, the first conductive pad 372a is located apart from the touch circuit board 340, and only the second conductive pad 372b directly contacts the touch circuit board 340 and is bonded to the touch circuit board 340.

The second conductive pad 372b according to an embodiment of the present invention has an area less than or equal (or substantially equal) to an area of the first conductive pad 372a. Accordingly, a pressure for the ultrasonically bonding process is applied to the second conductive pad 372b having an area less than or equal (or substantially equal) to about ½ of the area of the first conductive pad 372a. Thus, according to an embodiment of the present invention, as compared with a case where an entire surface of the touch pad 372 contacts the touch circuit board 340 to apply a pressure, a pressure applied per unit area increases, and the second conductive pad 372b and the wiring pattern portion 342 may be stably bonded to each other.

That is, according to some example embodiments of the present invention, because the touch pad 372 includes the first conductive pad 372a that includes a transparent conductive material, and the second conductive pad 372b that includes a material capable of being ultrasonically bonded with the first conductive pad 372a, and because the area of the second conductive pad 372b is less than the area of the first conductive pad 372a, the curable material 290' for forming the sealing member 290 may be prevented (or substantially prevented) from being uncured, and the touch pad 372 may be stably bonded to the touch circuit board 340. Accordingly, the reliability of the display device 10 may be improved.

Hereinafter, another embodiment of the present invention will be described with reference to FIG. 9. The description of the same configuration as that of the above-described embodiment of the present invention will be omitted for the convenience of explanation.

Figure 9:
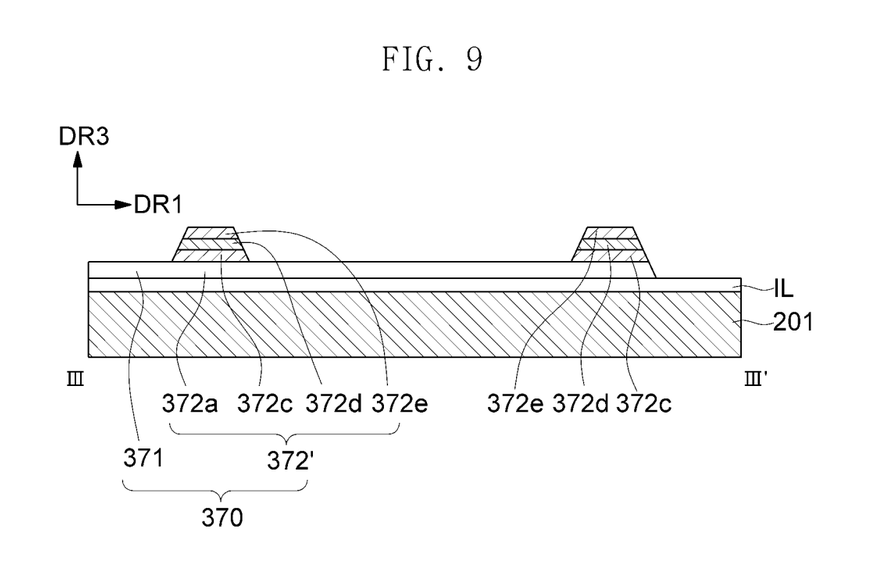
FIG. 9 is a cross-sectional view illustrating a touch pad area according to some example embodiments of the present invention.

FIG. 9 is a cross-sectional view illustrating a touch pad area according to another embodiment of the present invention.

Referring to FIG. 9, a touch pad 372' according to another embodiment of the present invention includes a first conductive pad 372a and second conductive pad 372c, 372d, and 372e having a multilayer structure in which a plurality of layers are stacked.

At least one layer of the second conductive pad 372c, 372d, and 372e includes a material applicable to ultrasonically bonding. Particularly, a bonding layer 372e, which is located farthest from the first conductive pad 372a and directly contacts the touch circuit board 340 to be bonded thereto, includes a material applicable to ultrasonically bonding. The bonding layer 372e may include a metal material including at least one of Ag, Mg, Al, Mo, Pt, Pd, Au, Ni, Nd, Ir, Cr, Li, Ca, Ti, Sn, and Cu. However, embodiments are not limited thereto, and a plurality of layers constituting the second conductive pad 372c, 372d, and 372e may all include a material applicable to ultrasonically bonding.

A contact layer 372c of the plurality of layers constituting the second conductive pad 372c, 372d, and 372e, which directly contacts the first conductive pads 372a, may include a metal material that has a relatively strong adhesion with the first conductive pads 372a. For example, each of the first conductive pad 372a and the contact layer 372c may include a metal of, for example, ITO and Ti. However, embodiments are not limited thereto, and the contact layer 372c may include various materials that have excellent adhesion with at least one of the first conductive pad 372a including a transparent conductive material and the bonding layer 372e including a material applicable to ultrasonically bonding. Accordingly, the first conductive pad 372a and the second conductive pad 372c, 372d, and 372e may be formed to overlap each other more stably.

Hereinafter, other embodiments of the present invention will be described with reference to FIGS. 10 to 15. Some repetitive description of the same configuration as that of the above-described embodiment of the present invention will be omitted for the convenience of explanation.

FIGS. 10 to 15 are plan views illustrating area A in FIG. 4 according to other embodiments of the present invention.

Figure 10:
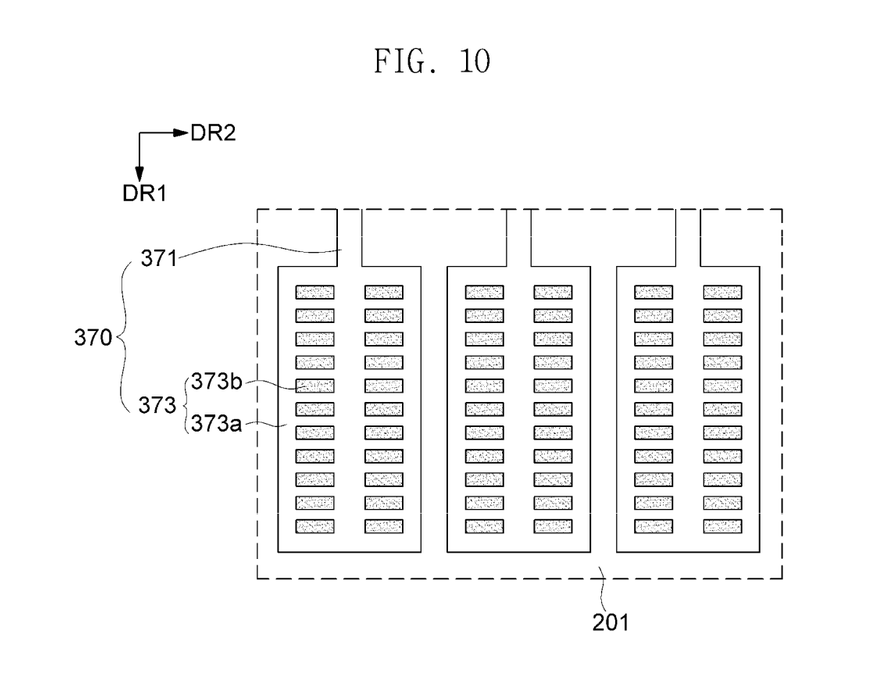
FIGS. 10 to 15 are plan views illustrating the area A in FIG. 4 according to some example embodiments of the present invention.
Figure 11:
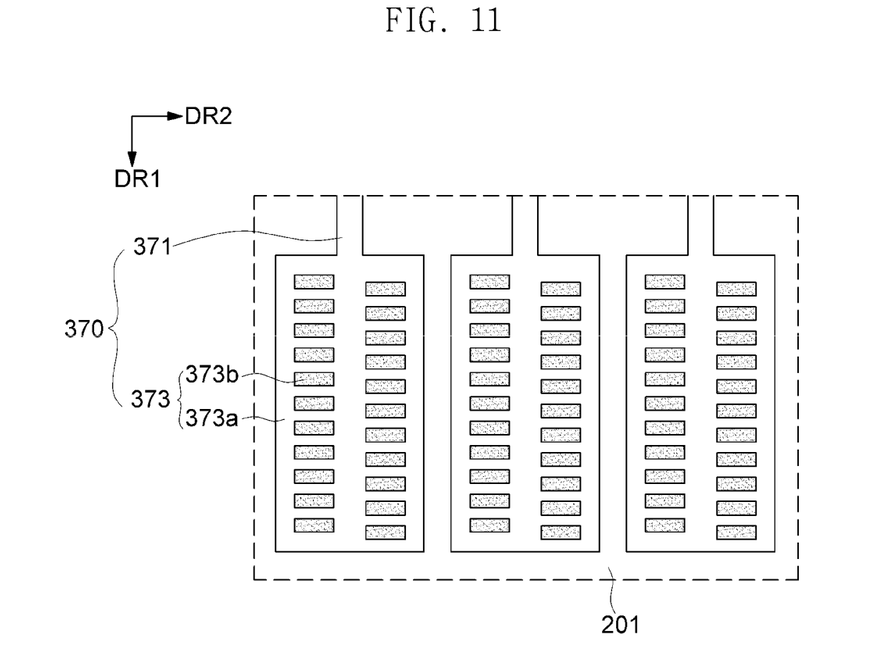

Referring to FIGS. 10 and 11, a touch pad 373 according to still another embodiment of the present invention includes a first conductive pad 373a and a plurality of second conductive pads 373b each having an island shape and overlapping one first conductive pad 373a. The plurality of second conductive pads 373b may be arranged in a matrix form in the first direction DR1 and the second direction DR2. That is, the plurality of second conductive pads 373b may be located along a plurality of rows and a plurality of columns. However, embodiments are not limited thereto, and the plurality of second conductive pads 373b may be located along one row or one column. The plurality of second conductive pads 373b may have a long line shape.

The plurality of second conductive pads 373b may each be arranged in parallel with adjacent ones of the second conductive pads 373b along the first and second directions DR1 and DR2 in a plan view, as illustrated in FIG. 10. Alternatively, the plurality of second conductive pads 373b may be arranged in a zigzag manner with reference to a virtual center line extending along the first direction DR1 in a plan view, as illustrated in FIG. 11.

Although each of the plurality of second conductive pads 373b is depicted in a quadrangular shape. However, embodiments are not limited thereto, and each of the second conductive pads 373b may be formed in various shapes such as circular, elliptical, and irregular shapes.

The first conductive pad 373a includes a transparent conductive material. For example, the first conductive pad 373a may include at least one of conductive oxides such as indium tin oxide (ITO), indium zinc oxide (IZO), zinc oxide (ZnO), and indium tin zinc oxide (ITZO).

The plurality of second conductive pads 373b include a material applicable to ultrasonically bonding. The plurality of second conductive pads 373b may include a metal material including at least one of Ag, Mg, Al, Mo, Pt, Pd, Au, Ni, Nd, Ir, Cr, Li, Ca, Ti, Sn, and Cu. The plurality of second conductive pads 373b may have a multi-layer structure in which a plurality of layers are stacked.

A total area of the plurality of second conductive pads 373b is less than an area of the first conductive pads 373a in a plan view. For example, the plurality of second conductive pads 373b may have an area less than or equal (or substantially equal) to about ½ of the area of the first conductive pad 373a. That is, an area where only the first conductive pad 373a including a transparent conductive material is located may be larger than or equal (or substantially equal) to about ½ of an entire area of the touch pad 373 in a plan view. Accordingly, the problem of the curable material 290' for forming the sealing member 290 that overlaps the touch pad 373 from being uncured may be prevented (or substantially prevented).

The first conductive pad 373a is spaced apart from the touch circuit board 340, and only the second conductive pads 373b directly contacts the touch circuit board 340 and is bonded to the touch circuit board 340. Thus, according to still another embodiment of the present invention, as compared with a case where an entire surface of the touch pad 373 contacts the touch circuit board 340 to apply a pressure, a pressure applied per unit area increases, and the second conductive pad 373b and the touch circuit board 340 may be stably bonded to each other.

Figure 12:
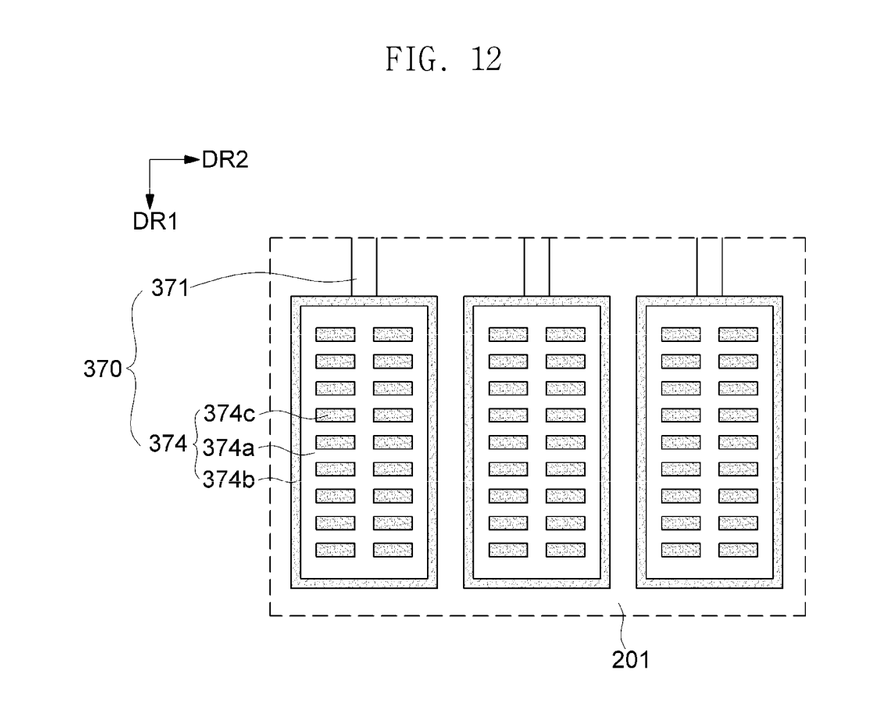

Referring to FIG. 12, a touch pad 374 according to still another embodiment of the present invention includes a first conductive pad 374a, a second conductive pad 374b in the form of a closed loop that overlaps an edge portion of the first conductive pad 374a in a plan view, and a plurality of third conductive pads 374c each having an island shape and overlapping one first conductive pad 374a.

Figure 13:
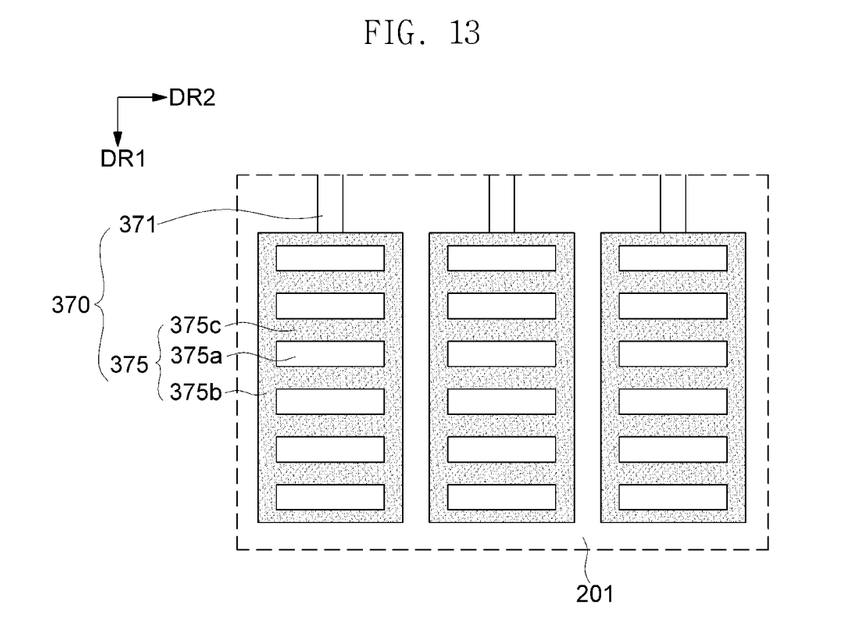

Referring to FIG. 13, a touch pad 375 according to still another embodiment of the present invention includes a first conductive pad 375a, a second conductive pad 375b in the form of a closed loop that overlaps an edge portion of the first conductive pad 375a in a plan view, and at least one third conductive pad 375c that is unitarily formed with the second conductive pad 375b and crosses a central portion of the touch pad 375. In such an embodiment, although it is depicted that the third conductive pad 375c extends parallel to the second direction DR2, embodiments are not limited thereto. In an embodiment, the third conductive pad 375c may extend parallel to the first direction DR1, and alternatively, the third conductive pad 375c may extend at a predetermined inclination so as not to be parallel or perpendicular to the first and second directions DR1 and DR2.

Figure 14:
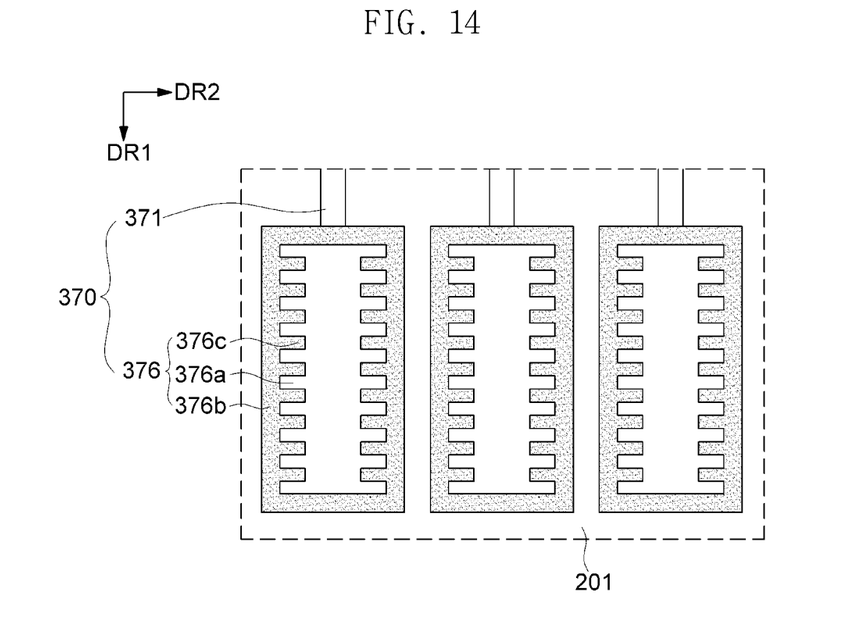

Referring to FIG. 14, a touch pad 376 according to still another embodiment of the present invention includes a first conductive pad 376a, a second conductive pad 376b in the form of a closed loop that overlaps an edge portion of the first conductive pad 376a in a plan view, and a plurality of third conductive pads 376c that are unitarily formed with the second conductive pad 376b and protrude from the second conductive pad 376b. In such an embodiment, although it is depicted that the third conductive pad 376c protrudes along the second direction DR2, embodiments are not limited thereto. In an embodiment, the third conductive pad 376c may protrude along the first direction DR1, and alternatively, the third conductive pad 376c may protrude at a predetermined inclination so as not to be parallel or perpendicular to the first and second directions DR1 and DR2. In an embodiment, the plurality of third conductive pads 376c may be arranged in a zigzag manner with reference to a virtual center line extending along the first direction DR1 in a plan view.

Figure 15:
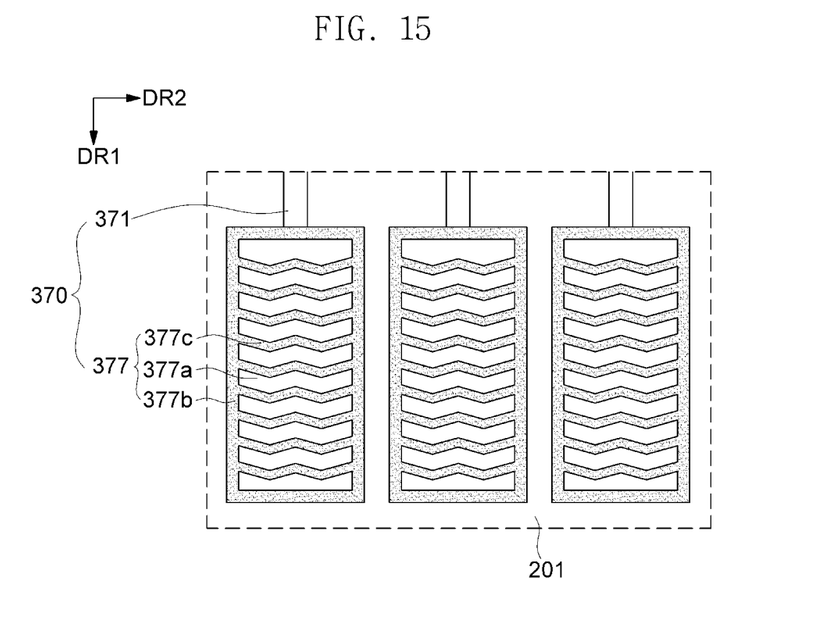

Referring to FIG. 15, a touch pad 377 according to still another embodiment of the present invention includes a first conductive pad 377a, a second conductive pad 377b in the form of a closed loop that overlaps an edge portion of the first conductive pad 377a in a plan view, and at least one third conductive pad 377c that is unitarily formed with the second conductive pad 377b and crosses the touch pad 377. Although the third conductive pad 377c is depicted as extending in a zigzag manner along the second direction DR2, embodiments are not limited thereto. In an embodiment, the third conductive pad 377c may extend in a zigzag manner along the first direction DR1, and alternatively, the third conductive pad 375c may extend in a zigzag manner at a predetermined inclination so as not to be parallel or perpendicular to the first and second directions DR1 and DR2.

The first conductive pads 374a, 375a, 376a, and 377a illustrated in FIGS. 12 to 15 include a transparent conductive material. For example, the first conductive pads 374a, 375a, 376a, and 377a may include at least one of conductive oxides such as indium tin oxide (ITO), indium zinc oxide (IZO), zinc oxide (ZnO), and indium tin zinc oxide (ITZO).

Each of the second conductive pads 374b, 375b, 376b, and 377b and the third conductive pads 374c, 375c, 376c, and 377c include a material applicable to ultrasonically bonding. For example, each of the second conductive pads 374b, 375b, 376b, and 377b and the third conductive pads 374c, 375c, 376c, and 377c may include a metal material including at least one of Ag, Mg, Al, Mo, Pt, Pd, Au, Ni, Nd, Ir, Cr, Li, Ca, Ti, Sn, and Cu. Each of the second conductive pads 374b, 375b, 376b, and 377b and the third conductive pads 374c, 375c, 376c, and 377c may have a multi-layer structure in which a plurality of layers are stacked. In addition, the second conductive pads 374b, 375b, 376b, and 377b and the third conductive pads 374c, 375c, 376c, and 377c may include a same (or substantially same) material. For example, the second conductive pads 374b, 375b, 376b, and 377b and the third conductive pads 374c, 375c, 376c, and 377c may be formed simultaneously (or substantially simultaneously) in a same (or substantially same) process.

A total area of respective corresponding ones of the second conductive pads 374b, 375b, 376b, and 377b and the third conductive pads 374c, 375c, 376c, and 377c is less than an area of each corresponding one of the first conductive pads 374a, 375a, 376a, and 377a in a plan view, in respective embodiments of the present invention. For example, the second conductive pads 374b, 375b, 376b, and 377b and the third conductive pads 374c, 375c, 376c, and 377c may together have areas less than or equal (or substantially equal) to about ½ of the areas of the first conductive pads 374a, 375a, 376a, and 377a, respectively. That is, an area where only the first conductive pads 374a, 375a, 376a, and 377a including a transparent conductive material are located may be larger than or equal (or substantially equal) to about ½ of entire areas of the touch pads 374, 375, 376, and 377 in a plan view, respectively. Accordingly, the problem of the curable material 290' for forming the sealing member 290 that overlaps the touch pads 374, 375, 376, and 377 being uncured may be prevented (or substantially prevented).

The first conductive pads 374a, 375a, 376a, and 377a are spaced apart from the touch circuit board 340, and only the second conductive pads 374b, 375b, 376b, and 377b and the third conductive pads 374c, 375c, 376c, and 377c directly contact the touch circuit board 340 and are bonded to the touch circuit board 340. Thus, according to other embodiments of the present invention, as compared with a case where the entire surface of the touch pads 374, 375, 376, and 377 contact the touch circuit board 340 to apply a pressure, a pressure applied per unit area increases, and the second conductive pads 374b, 375b, 376b, and 377b and the third conductive pads 374c, 375c, 376c, and 377c may be stably bonded with the touch circuit board 340.

As set forth hereinabove, in a display device according to some embodiments of the present invention, a touch pad that is located overlapping a sealing member for sealing a substrate and a sealing substrate includes a first conductive pad, which is transparent, and a second conductive pad that can be ultrasonically bonded to the first conductive pad. Accordingly, the display device may prevent (or substantially prevent) a curable material for forming the sealing member from being uncured and the touch pad and a touch circuit board may be ultrasonically bonded to each other stably.

While aspects of the present invention have been illustrated and described with reference to some example embodiments thereof, it will be apparent to those of ordinary skill in the art that various changes in form and detail may be formed thereto without departing from the spirit and scope of the present invention, as defined by the following claims and their equivalents.

What is claimed is:
1. A display device comprising:
   a substrate;
   a sealing substrate opposing the substrate, and comprising a first surface adjacent to the substrate and a second surface opposing the first surface;
   a pixel unit between the substrate and the sealing substrate;

a sealing member between the substrate and the sealing substrate, spaced apart from the pixel unit, and bonding the substrate and the sealing substrate to each other;

a touch sensing unit on the second surface of the sealing substrate;

a touch pad on the second surface of the sealing substrate, and overlapping the sealing member; and a touch circuit board on the touch pad and connected to the touch pad, wherein the touch pad comprises:

a first conductive pad; and a second conductive pad on the first conductive pad, the second conductive pad having an area less than an area of the first conductive pad, and wherein the second conductive pad is ultrasonically bonded to the touch circuit board, and wherein the first conductive pad comprises a transparent conductive material.

2. The display device of claim 1, wherein the first conductive pad comprises at least one of indium tin oxide (ITO), indium zinc oxide (IZO), zinc oxide (ZnO), or indium tin zinc oxide (ITZO).

3. The display device of claim 1, wherein the second conductive pad comprises at least one of Ag, Mg, Al, Mo, Pt, Pd, Au, Ni, Nd, Ir, Cr, Li, Ca, Ti, Sn, or Cu.

4. The display device of claim 1, wherein the second conductive pad has a multilayer structure in which a plurality of layers are stacked.

5. The display device of claim 1, wherein the second conductive pad has an area less than or equal to ½ of the area of the first conductive pad.

6. The display device of claim 1, wherein the first conductive pad is apart from the touch circuit board, and the second conductive pad directly contacts the touch circuit board.

7. The display device of claim 1, wherein the sealing member comprises glass frit or a polymer resin.

8. The display device of claim 1, wherein the touch circuit board comprises a base film, a cover film, and a wiring pattern portion between the base film and the cover film.

9. The display device of claim 8, wherein the wiring pattern portion directly contacts the second conductive pad, and is ultrasonically bonded to the second conductive pad.

10. The display device of claim 8, wherein the wiring pattern portion comprises at least one of Ag, Mg, Al, Mo, Pt, Pd, Au, Ni, Nd, Ir, Cr, Li, Ca, Ti, Sn, or Cu.

11. The display device of claim 1, wherein the second conductive pad has a closed loop shape that overlaps an edge portion of the first conductive pad in a plan view.

12. The display device of claim 11, wherein the second conductive pad further comprises a third conductive pad extending from the second conductive pad in the closed loop shape.

13. The display device of claim 1, wherein the second conductive pad is formed as a plurality of lines or a plurality of islands.

14. The display device of claim 13, wherein the second conductive pad has a zigzag shape.

15. A method of manufacturing a display device, the method comprising:

locating a pixel unit on a substrate;

locating a touch pad on a sealing substrate, the touch pad comprising a first conductive pad, and a second conductive pad on the first conductive pad and having an area less than an area of the first conductive pad;

locating a curable material between the substrate and the sealing substrate to overlap the touch pad;

outputting a laser beam toward the curable material through at least a part of the touch pad;

forming a sealing member by curing the curable material;

locating a touch circuit board on the touch pad; and ultrasonically bonding the second conductive pad and the touch circuit board to each other, and wherein the first conductive pad comprises a transparent conductive material.

16. The method of claim 15, wherein the first conductive pad comprises at least one of indium tin oxide (ITO), indium zinc oxide (IZO), zinc oxide (ZnO), or indium tin zinc oxide (ITZO).

17. The method of claim 15, wherein the second conductive pad comprises at least one of Ag, Mg, Al, Mo, Pt, Pd, Au, Ni, Nd, Ir, Cr, Li, Ca, Ti, Sn, or Cu.

18. The method of claim 15, wherein the second conductive pad has a multilayer structure in which a plurality of layers are stacked.

19. The method of claim 15, wherein the second conductive pad has an area less than or equal to ½ of the area of the first conductive pad.

20. The method of claim 15, wherein the sealing member comprises glass frit or a polymer resin.

* * * * *